US012772696B2

(12) United States Patent
Lee et al.

(10) Patent No.: US 12,772,696 B2
(45) Date of Patent: Oct. 20, 2026

(54) DISPLAY APPARATUS

(71) Applicant: LG DISPLAY CO., LTD., Seoul (KR)

(72) Inventors: Juyeob Lee, Paju-si (KR); Chan Park, Paju-si (KR); Yongsoo Kim, Paju-si (KR); Moowook Bang, Paju-si (KR); Kilsu Park, Paju-si (KR); Eungchul Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 352 days.

(21) Appl. No.: 18/050,987

(22) Filed: Oct. 29, 2022

(65) Prior Publication Data

US 2023/0148069 A1 May 11, 2023

(30) Foreign Application Priority Data

Nov. 8, 2021 (KR) ........................ 10-2021-0152204

(51) Int. Cl.
*H10K 59/80* (2023.01)
*H10K 59/12* (2023.01)
*H10K 102/00* (2023.01)

(52) U.S. Cl.
CPC ........... *H10K 59/871* (2023.02); *H10K 59/12* (2023.02); *H10K 2102/311* (2023.02)

(58) Field of Classification Search
CPC ................. H10K 50/841; H10K 59/12; H10K 2102/311; H10K 77/10; H10K 77/111; G06F 1/1641; G06F 1/1652; G09G 3/035; G09G 3/3233; G09G 2320/0233; G09F 9/301
See application file for complete search history.

(56) References Cited

U.S. PATENT DOCUMENTS 10,020,462 B1 * 7/2018 Ai ........................ H10K 59/871
2019/0132947 A1 * 5/2019 Koo ........................ G09F 9/301
2019/0165060 A1 5/2019 Choi et al.

FOREIGN PATENT DOCUMENTS

CN 104466007 A * 3/2015 ....... G02F 1/134309
CN 110021235 A 7/2019
CN 111295870 A 6/2020
KR 10-2016-0039103 A 4/2016
KR 20160148686 A 12/2016
(Continued)

OTHER PUBLICATIONS

Sun_English1, sun translation (Year: 2015).*
Office Action in Korean Appln. No. 10-2021-0152204, mailed on Jun. 4, 2025, 16 pages (with English translation).

*Primary Examiner* — Minsun O Harvey
*Assistant Examiner* — Alexander Ehrlich
(74) *Attorney, Agent, or Firm* — Fish & Richardson P.C.

(57) ABSTRACT

A display device includes a pixel substrate having pixels; and a cover window disposed on an upper surface of the pixel substrate and including a folding pattern, and the folding pattern may make an angle between 5 degrees and 40 degrees with a folding line of the display device. Another aspect relates to a display device including a pixel substrate having pixels; and a cover window disposed on an upper surface of the pixel substrate and including a folding pattern, and the folding pattern includes a first folding pattern and a second folding pattern and the first folding pattern and the second folding pattern each may make a different acute angle in the same direction with a folding line of the display device.

17 Claims, 18 Drawing Sheets

A-A'

(56) References Cited

FOREIGN PATENT DOCUMENTS

| | | | |
|---|---|---|---|
| KR | 10-2017-0033463 | A | 3/2017 |
| KR | 10-2018-0069524 | A | 6/2018 |
| KR | 20190049242 | A | 5/2019 |
| KR | 10-2020-0011056 | A | 2/2020 |

* cited by examiner

DISPLAY APPARATUS

CROSS REFERENCE TO RELATED APPLICATION

The present application claims the priority of Korean Patent Application No. 10-2021-0152204 filed on Nov. 8, 2021, which is hereby incorporated by reference in its entirety.

BACKGROUND

Field of the Disclosure

The present disclosure relates to a display device and particularly to a foldable display device having an improved folding pattern that is equipped in a folding area.

Description of the Background

Recently, supply of flexible display devices is robust. The flexible display devices have been developed to a rollable display device, a foldable display device and the like and such devices have been commercialized. A foldable display device refers to a device that can be folded and is mainly applied in portable terminals thanks to improved portability.

Though a display device is a thin panel but it has a predefined thickness, physical deformation may be caused in a folding area when the device is folded. If such deformation is big, the display device around a folding line may lose a function as a panel that displays an image. To solve such a problem, related art has used a method to insert patterns to a cover window.

It is possible to secure an area where a panel can be folded by inserting multiple patterns in the same direction as the folding line. By doing so, a panel can repeat folding comfortably in an area secured by the pattern without requiring any physical modification.

However, such pattern being used by related art has a problem of causing an adverse effect, e.g., a moire effect. Moire refers to an effect by which a user feels screen flickering, or a sees a certain pattern due to interference with pixels in an area where the patterns are inserted. Related art physically resolved a problem of folding; however, a user could not see an image to the fullest because of the moire effect in the folding area, and felt that quality of image deteriorated.

SUMMARY

Accordingly, the present disclosure is to provide a display device and particularly to a display device that inserted improved folding patterns aimed at overcoming the moire effect arising in a folding area.

In an aspect of the present disclosure, a display device includes a pixel substrate equipped with pixels; and a cover window disposed on an upper surface of the pixel substrate and including a folding pattern, and the folding pattern makes an angle between 5 degrees and 40 degrees with a folding line of the display device.

In another aspect of the present disclosure, a display device includes a pixel substrate equipped with pixels; and a cover window disposed on an upper surface of the pixel substrate and including a folding pattern, and the folding pattern includes a first folding pattern and a second folding pattern and the first folding pattern and the second folding pattern each may make a different acute angle in the same direction with a folding line of the display device.

In various aspects of the present disclosure, the moire effect is reduced by decreasing repeatability of a repeated pattern occurring in a folding area. If a pattern occurring when a folding pattern and pixels interfere with each other repeatedly takes place, the moire effect may be reduced by reducing moire visibility that a user experiences by expanding a repetition cycle. Or, by giving randomness in a length or an angle and making the interference pattern not repeatedly show, the moire effect may be reduced.

In various aspects of the present disclosure, the moire effect is reduced and a user can see an image to the fullest without deterioration in image quality in a folding area.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
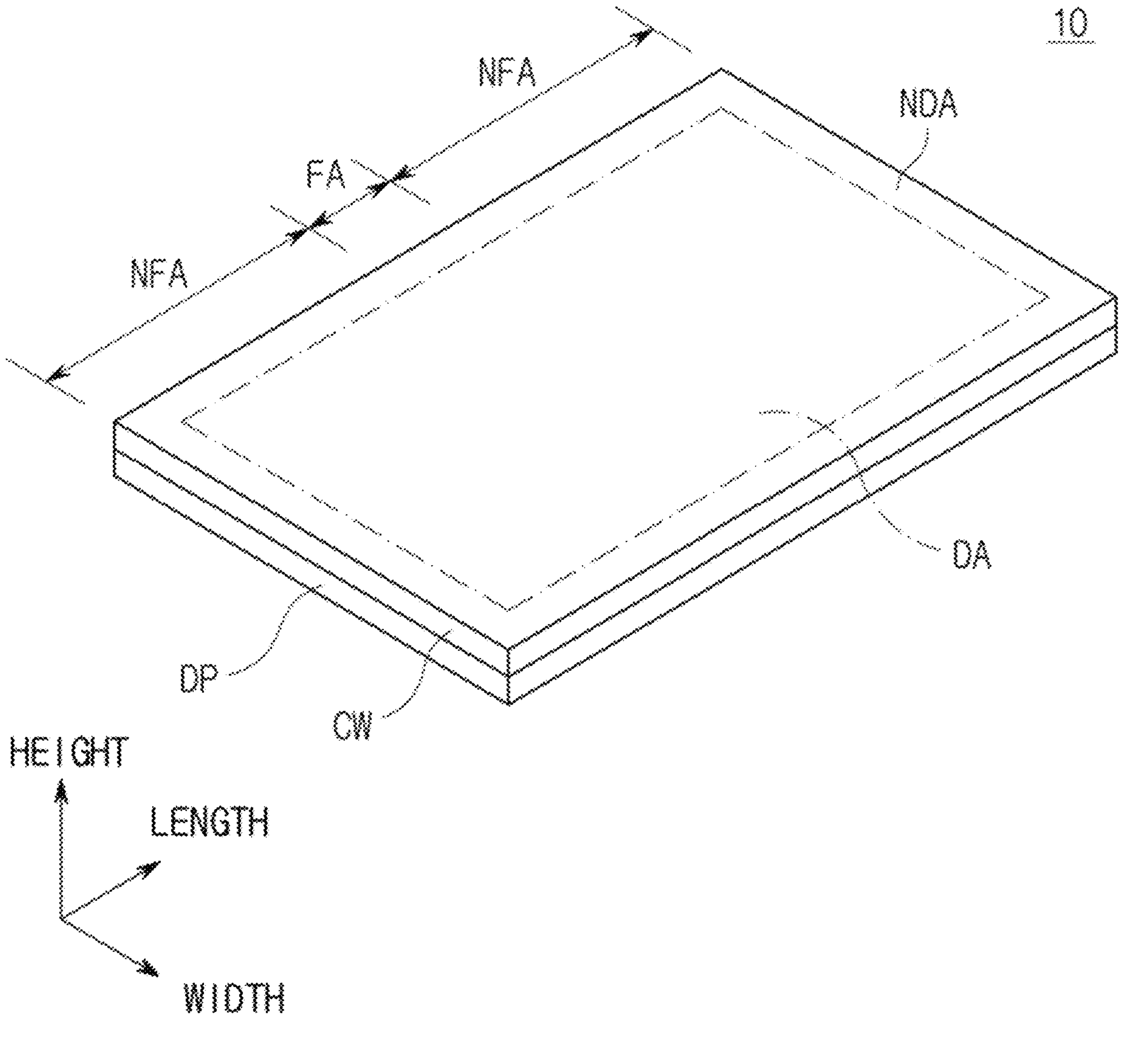
FIG. 1 is a drawing that shows a display device according to the present disclosure.

Hereinafter, the aspects will be described with reference to the accompanying drawings. When an element (or an area, a layer, a part and the like) is 'on' another element, is 'connected' with, or is 'coupled' with another element, the element may be directly connected with or coupled to another element or a third intervening element may be disposed therebetween.

Like reference numerals of the accompanying drawings denote like elements. In addition, thicknesses, ratios and dimensions of the elements in the accompanying drawings are exaggerated for convenience of describing the specification. The term "and/or" includes any and all combinations of one or more of the associated listed items.

Though terms such as 'a first', or 'a second' are used to describe various components, these components are not confined by these terms. These terms are merely used to distinguish one component from the other component. For example, without departing from the scope of the rights of various aspects of the present disclosure, a first component may be referred to as a second component, and similarly, a second component may be referred to as a first component. The singular forms expressed herein are intended to include the plural forms as well, unless the context expressly indicates otherwise.

Terms such as 'below', 'at a lower portion', 'on', 'at an upper portion' and the like are used to describe position relation of parts illustrated in the accompanying drawings. Such terms are of relative concept, and are explained based on the directions marked in the drawings.

It should be understood that terms such as 'comprise', or 'have' and the like are used only to designate that there are features, numbers, steps, operations, components, parts or combination thereof, however such terms do not preclude existence or addition of one or more another features, numbers, steps, operations, components, parts or combination thereof. In the present disclosure, widths, lengths and heights in the present disclosure are merely used to distinguish one feature, number, step, operation, component, part or combination thereof from the other, and widths, lengths and heights may be substituted with each other depending on an angle at which an object is viewed, and should not be construed to limit the scope of the rights of various aspects of the present disclosure.

FIG. 1 is a drawing that shows a display device according to the aspect of the present disclosure.

Referring to FIG. 1, the display device 100 includes a pixel substrate (DP) and a cover window (CW) disposed on the pixel substrate (DP).

The display device 100 includes a folding area (FA) and non-folding areas (NFA). The folding area (FA) refers to a part where the display device is folded, and the non-folding area (NFA) refers to a part where the display device is not folded. Therefore, if the display device 100 is folded, the folding area (FA) is bent, and the non-folding area (NFA) maintains a plane without being bent. The aspect referring to FIG. 1 illustrates that a folding area (FA) is positioned at the center of the display device 100, and the non-folding area (NFA) is positioned on a rim of the display device 100, however the concept of the present disclosure includes other forms as well. For example, the folding area (FA) may be positioned on a rim of the display device 100 and the non-folding area (NFA) may be positioned at the center of the display device 100. For another example, the folding area (FA) may be formed throughout the entire surface of the display device 100, and such device may be a so-called rollable display device. For another example, the folding area (FA) may be formed at areas other than the center of the display device 100, and thus, multi-folding may be implemented. The folding area (FA) may be formed at an upper portion and/or a lower portion, and at this instance, a so-called edge folding may be implemented.

The display device 100 includes a display area (DA) and a non-display area (NDA). The display area (DA) refers to an area where a light emitting element is positioned in the pixel substrate (DP) and an image is displayed, while the non-display area (NDA) may refer to an area the light emitting element is not positioned. In the non-display area (NDA), a power unit to drive the display device, a source driver or a gate driver may be mounted. Also, a gate driver in the pixel substrate (DP) may be implemented to be a Gate In Panel (GIP) where a gate driver is embedded in the pixel substrate.

Corresponding to the folding area (FA) and the non-folding area (NFA) of the display device 100, the folding area (FA) and the non-folding area (NFA) may be defined in the cover window (CW) as well. That is, a center of the cover window (CW) may be defined as the folding area (FA) which can be folded, and a rim of the cover window (CW) may be defined as the non-folding area (NFA) which cannot be folded.

Corresponding to the display area (DA) and the non-display area (NDA) of the display device 100, the display area (DA) and the non-display area (NDA) may be defined in the pixel substrate (DP) as well. The cover window (CW) mentioned above may include a bottom coating layer, a window layer disposed on the bottom coating layer, and a top coating layer which is an upper layer of the window layer.

Meanwhile, directions of a width, a length and a height are marked in the accompanying drawings, and such directions are for convenience of explanation and do not confine the scope of the rights of the present disclosure. Such directions are to present a width, a length and a height viewed as in FIG. 1 and the width, the length and the height may be defined differently when viewed from another direction. The definitions of a width, a length and a height are presented the same as FIG. 1 throughout the present disclosure.

Figure 2:
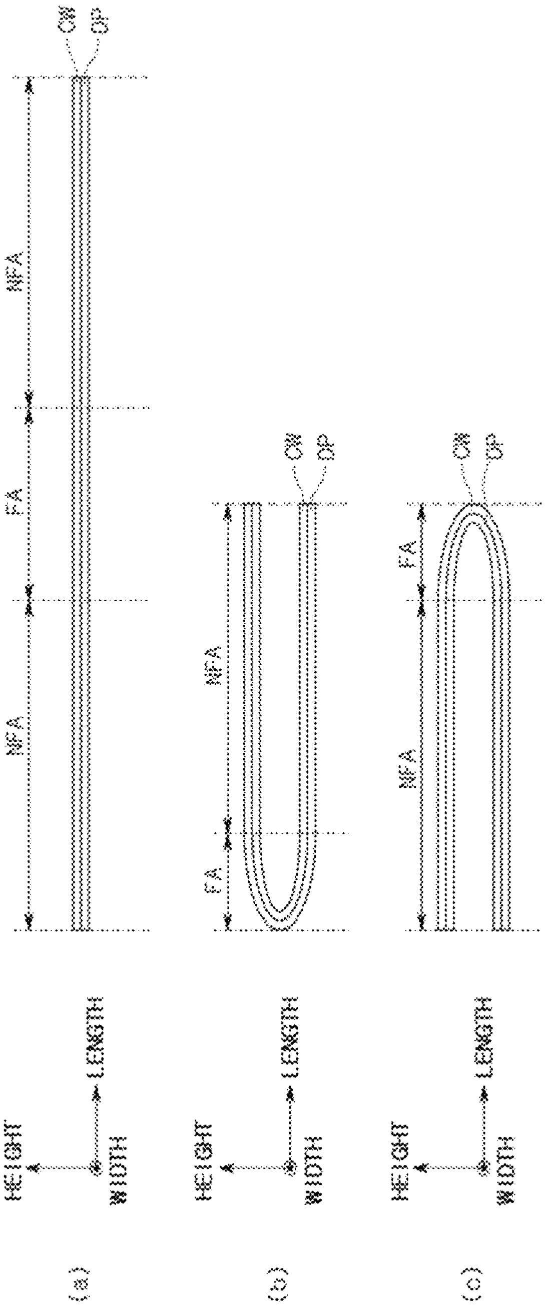
FIGS. 2(*a*), 2(*b*) and 2(*c*) are side views of the display device.

FIGS. 2(*a*), 2(*b*) and 2(*c*) are side views of the display device.

Referring to (a) of FIG. 2, the display device 100 includes the pixel substrate (DP) and the cover window (CW) disposed on the pixel substrate (DP). In the cover window (CW), some areas are defined as the non-folding area (DFA) and some area is defined as the folding area (FA) in a length-wise direction. Specifically, in a length-wise direction, a center of the display device 100 is defined as the folding area (FA), and each of the left and the right side of the folding area (FA) is defined as the non-folding area (NFA). Therefore, when the display device 100 is folded, the folding area (FA) may be bent and be in contact with the non-folding area (NFA).

Referring to FIG. 2(*b*), the display device 100 may be folded in an out-folding manner. The out-folding refers to an approach that leaves the pixel substrate (DP) to be exposed outside when the display device 100 is folded. As illustrated in FIG. 2(*b*), since the cover window (CW) is folded towards the inside of the display device 100, the pixel substrate (DP) is exposed outside as the non-folding areas (NFA) meet with each other based on the folding area (FA) in the cover window (CW).

Referring to FIG. 2(*a*), the display device 100 may be folded in an in-folding manner. The in-folding refers to an approach that the pixel substrate (DP) is hidden inside when the display device 100 is folded. As illustrated in FIG. 2(*c*), since the cover window (CW) is folded towards the outside of the display device 100, the non-folding areas (NFA) meet with each other based on folding area (FA) in the pixel substrate (DP), and the pixel substrate (DP) is hidden inside.

Figure 3:
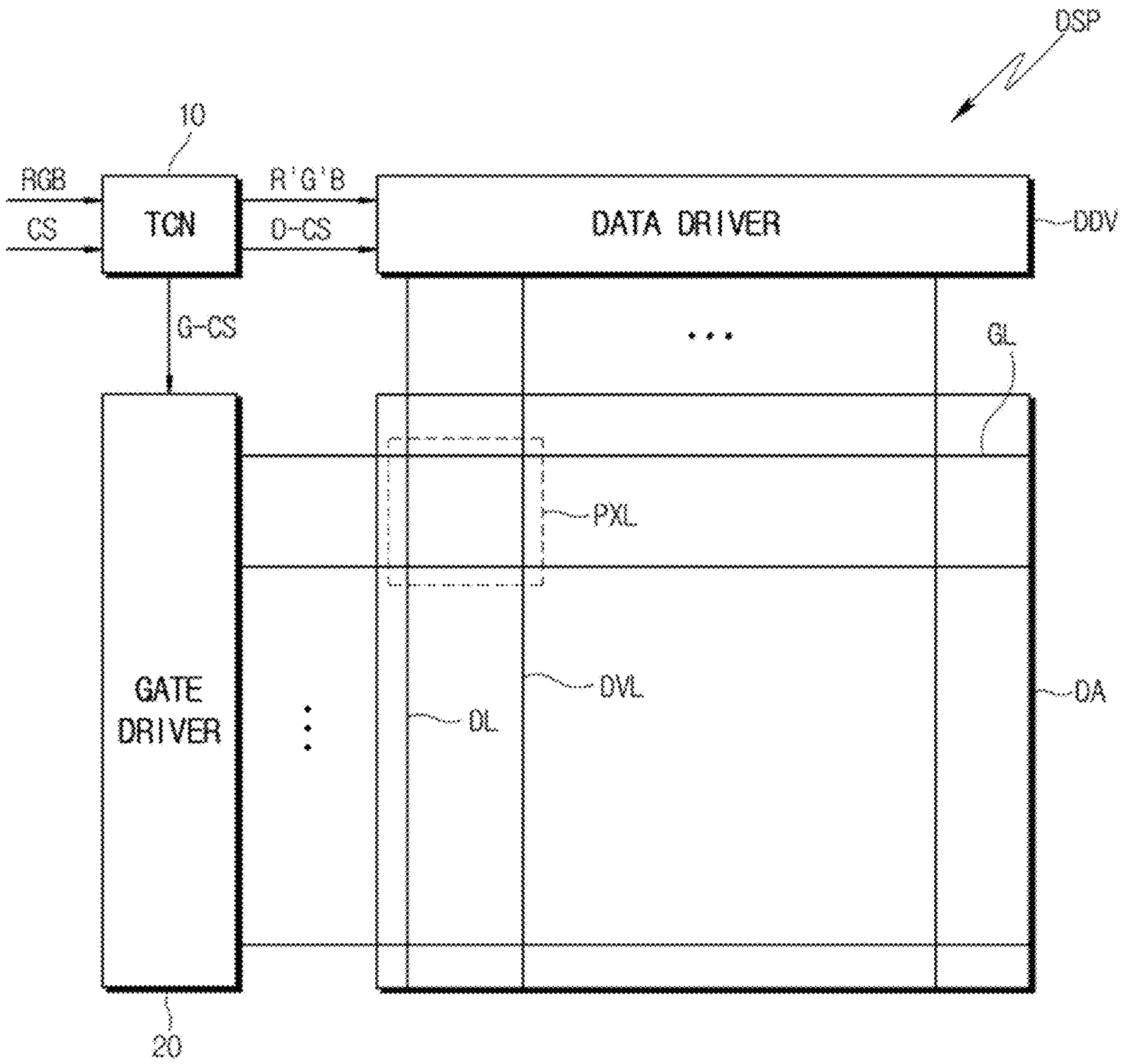
FIG. 3 is a block diagram according to the present disclosure.

FIG. 3 is a block diagram according to the aspect of the present disclosure.

Figure 4:
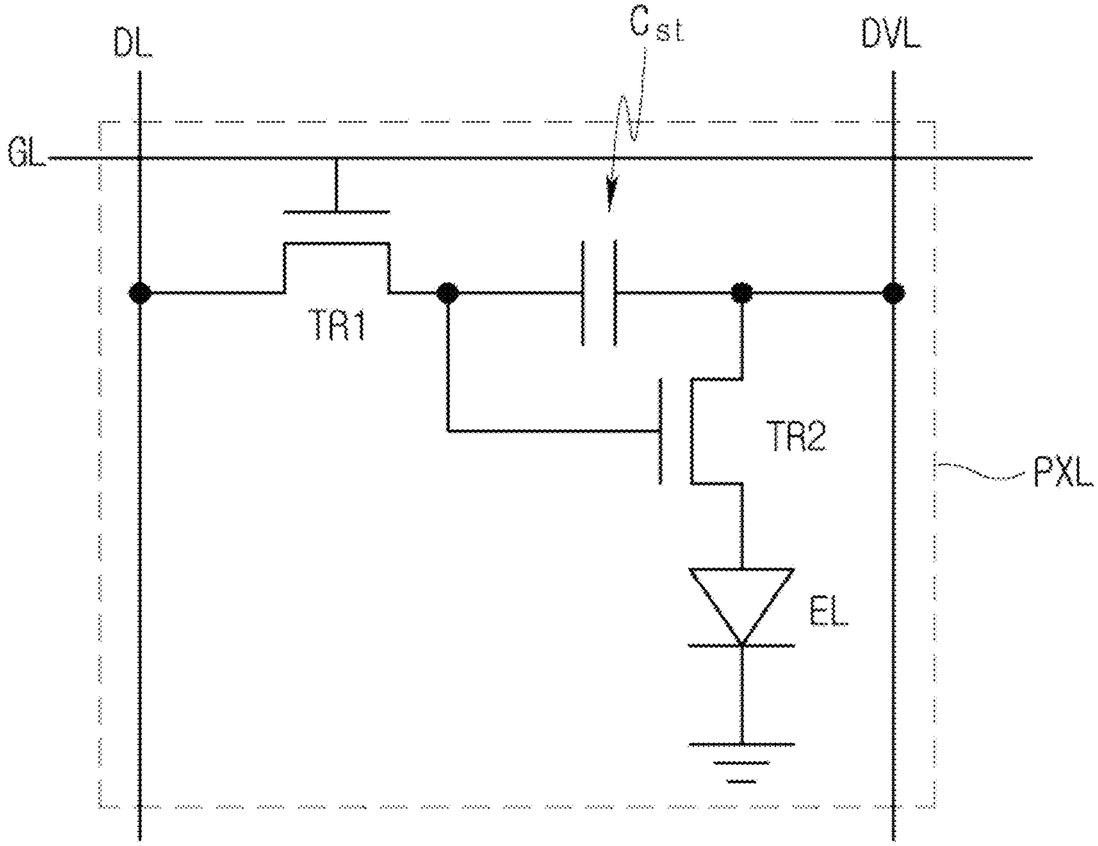
FIG. 4 is a circuit diagram of a pixel of FIG. 3.

FIG. 4 is a circuit diagram of a pixel (PXL) presented in FIG. 3.

Referring to FIGS. 3 and 4, the display device 100 according to the aspect includes pixels (PXL) provided in the display area (DA), a gate driver (GDV) and a data driver (DDV) that drive pixels, and a timing controller (TCN) that controls driving of the gate driver (GDV) and the data driver (DDV).

Each pixel (PXL) is provided in the display area (DA) and includes a wiring part consisting of a gate line (GL), a data line (DL) and a driving voltage line (DVL), a thin film transistor connected to the wiring part, a capacitor (Cst) and an organic light emitting element (EL) connected to the thin film transistor.

The gate line (GL) extends in one direction. The data line (DL) extends in the other direction that crosses the gate line (GL). The driving voltage line (DVL) extends in a direction substantially the same as the direction of the data line (DL). The gate line (GL) transmits a gate signal to the thin film transistor, the data line (DL) transmits a data signal to the thin film transistor and the driving voltage line (DVL) supplies driving voltage to the thin film transistor.

The thin film transistor may include a driving thin film transistor (TR2) to control the organic light emitting element (EL) and a switching thin film transistor (TR1) to switch the driving thin film transistor (TR2) may be included. The aspect of the present disclosure explains that one pixel (PXL) includes two thin film transistors (TR1, TR2), but is not limited thereto. One pixel (PXL) may include one thin film transistor and one capacitor, or one pixel (PXL) may include three or more thin film transistors and two or more capacitors.

When it comes to the switching thin film transistor (TR1), a gate electrode is connected to the gate line (GL), and a source electrode is connected to the data line (DL). A drain electrode of the switching thin film transistor (TR1) is connected to the gate electrode of the driving thin film transistor (TR2). The switching thin film transistor (TR1) transmits the data signal applied to the data line (DL) according to the gate signal applied to the gate line (GL) to the driving thin film transistor (TR2).

When it comes to the driving thin film transistor (TR2), a gate electrode is connected to a drain electrode of the switching thin film transistor, a source electrode is connected to the driving voltage line (DVL) and a drain electrode is connected to the organic light emitting element (EL).

The organic light emitting element (EL) includes a light emitting layer (not illustrated), and a first electrode (not illustrated) and a second electrode (not illustrated) are disposed in sides opposite to each other with the light emitting layer disposed therebetween. The first electrode is connected to the drain electrode of the driving thin film transistor (TR2). Common voltage is applied to the second electrode, and a light emitting layer (EML) displays an image by emitting light or not emitting light according to an output signal of the driving thin film transistor (TR2). In this instance, the light emitted from the light emitting layer (EML) may be a white light or a color light.

The capacitor (Cst) may be connected between a source electrode and the gate electrode of the driving thin film transistor (TR2), and charges and maintains the data signal inputted to the gate electrode of the driving thin film transistor (TR2).

The timing controller (TCN) receives a plurality of video signals (RGB) and a plurality of control signals (CS) from the outside of the display device. The timing controller (TCN) converts a data format of the image signals (RGB) to be suited to the interface specification of the data driver (DDV), and provides the converted video signals (R' G' B') to the data driver (DDV). Also, the timing controller (TCN) generates a data control signal (D-CS, for example, an output start signal, a horizontal start signal and the like) and a gate control signal (G-CS, for example, a vertical start signal, a vertical clock signal and a vertical clock bar signal) based on a plurality of control signals (CS). The data control signal (DCS) is provided to the data driver (DDV) and the gate control signal (G-CS) is provided to the gate driver (GDV).

The gate driver (GDV) sequentially outputs the gate signals in response to the gate control signal (G-CS) provided from the timing controller (TCN). Therefore, a plurality of pixels (PXL) may be sequentially scanned by the gate signal on a row basis.

The data driver (DDV) converts the video signals (R' G'B') in response to the data control signal (D-CS) supplied by the timing controller (TCN) into data signals and outputs the data signals. The outputted data signals are applied to the pixels (PXL).

Therefore, each pixel (PXL) is turned on by the gate signal and the pixel (PXL) that is turned on receives the corresponding data voltage from the data driver (DDV) and displays an image of gray scale as intended.

Hereinafter, the display device according to various aspects will be explained, which has the folding pattern of a diagonal line and reduces the moire effect thanks to modification applied to elements of the folding pattern.

Figure 5:
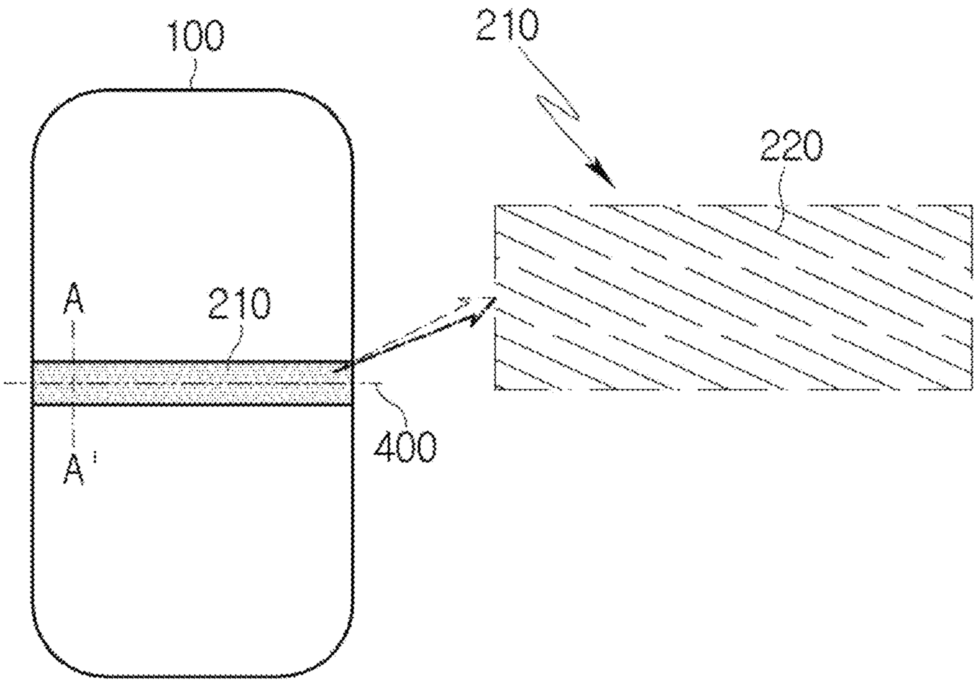
FIG. 5 is a schematic view that shows the display device and a folding pattern equipped therein according to the aspect of the present disclosure.

FIG. 5 is a schematic view that shows the display device and a folding pattern equipped therein according to the aspect of the present disclosure.

The display device 100 according to the aspect of the present disclosure includes a pixel substrate (not illustrated) equipped with pixels; and a cover window (not illustrated) disposed on an upper surface of the pixel substrate and includes a folding pattern 220, and the folding pattern 220 may make an angle between 5 degrees and 40 degrees with the folding line 400 of the display device 100.

According to the aspect, the display device 100 may be folded along the folding line 400. In such a case, folding includes folding, bending and rolling. Folding in the present disclosure is explained centering on bending, but is not limited thereto.

Figure 6:
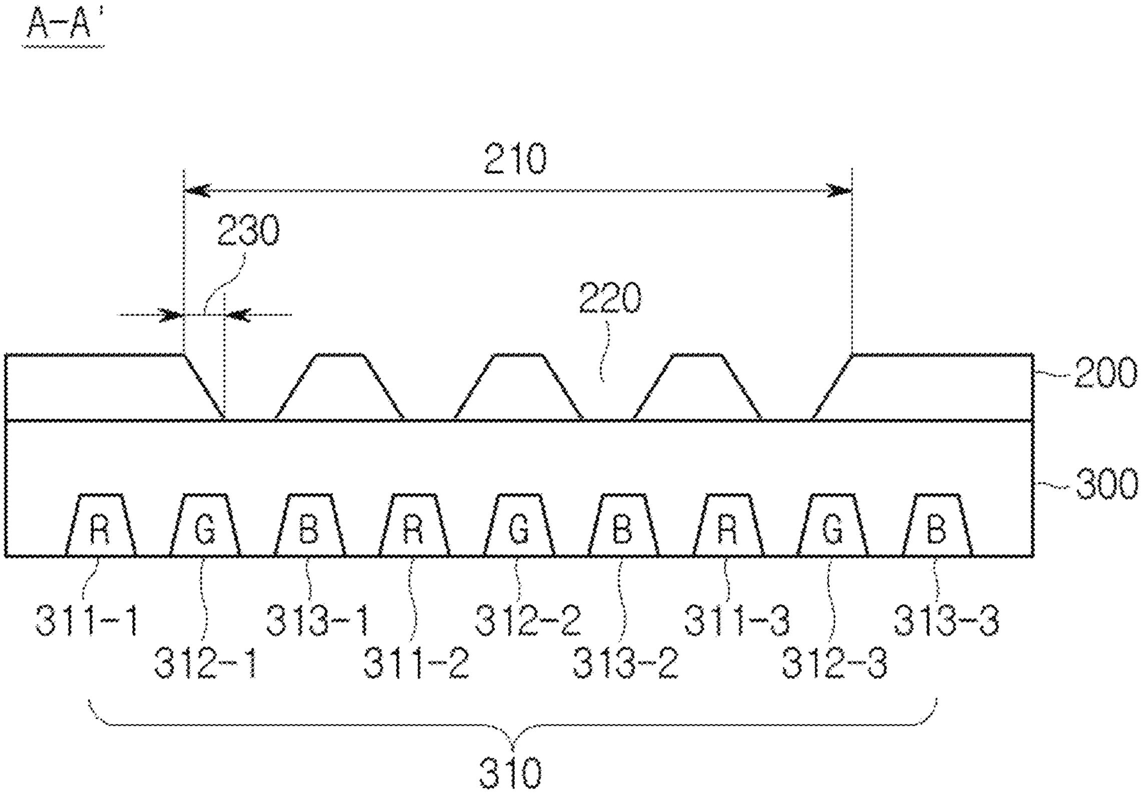
FIG. 6 is a cross-sectional view of a folding area of the display device according to the present disclosure.

FIG. 6 is a sectional view of a folding area of the display device according to the aspect of the present disclosure. The display device 100 may have a structure having a pixel substrate 300 equipped with pixels 310 and a cover window having a folding pattern 220 disposed on an upper surface of the pixel substrate 300. FIG. 6 shows the pixel substrate 300 contacts with the cover window 200, however other substrate or layer may be disposed additionally between the pixel substrate 300 and the cover window 200.

The pixel substrate 300 may be the one well known as a substrate designed to display an image in a liquid crystal display device or an organic light emitting display device. The pixel substrate 300 may be formed of glass, plastic and the like. A plurality of pixels 310 may be arranged in the pixel substrate 300. The pixels 310 may include RGB pixels (311_1, 311_2, 311_3—Red Pixels; 312_1, 312_2, 312_3—Green Pixels; and 313_1, 313_2, 313_3—Blue Pixels).

The pixels 310 may be arranged regularly. For example, the pixel 310 may be arranged in a square shape in which a virtual line connecting the nearest pixels of the same color (hereinafter referred to as a pixel pattern) stands side by side with the folding line 400. Alternatively, the pixel pattern may be arranged to make an angle of 45 degrees with the folding line 400.

The cover window 200 may be disposed on an upper surface of the pixel substrate 300. The cover window 200 may be the one well known to be disposed to cover the pixel substrate 300, and protect the pixel substrate 300 from dust, oxygen, moisture or physical elements. The cover window 200 may include glass, plastic and/or other material and is not limited thereto.

The display device 100 may be a display device where a user may fold and unfold a portion thereof. The display device 100 may be configured to be folded and unfolded along the folding line 400. The folding line 400 may refer to a virtual line of the display device, serving as a reference to fold. The folding line 400 may stand side by side with a horizontal side or a vertical side based on a rectangular shaped display device. The rest of the description will be set forth based on the folding line 400 configured to stand side by side with a side of the display device as mentioned above, however the folding line 400 is not limited thereto, and if the folding line 400 is configured not to stand side by side with the display device, the rest of configuration will be understood based on the folding line 400.

The cover window 200 may include the folding pattern 220 so that the display device 100 can be easily folded and unfolded. The folding pattern 220 in the cover window 200 is a concave part formed by etching and the like. The folding area 210 is an area where the folding pattern 220 is formed in the cover window 200.

The moire is an effect where a certain repeated pattern is formed and the pattern is recognized visibly by a user. The pixels 310 arranged regularly and repeatedly cause visual interference with the folding pattern and if the interfered areas have repeated patterns, a user may recognize it as the moire effect.

Figure 10:
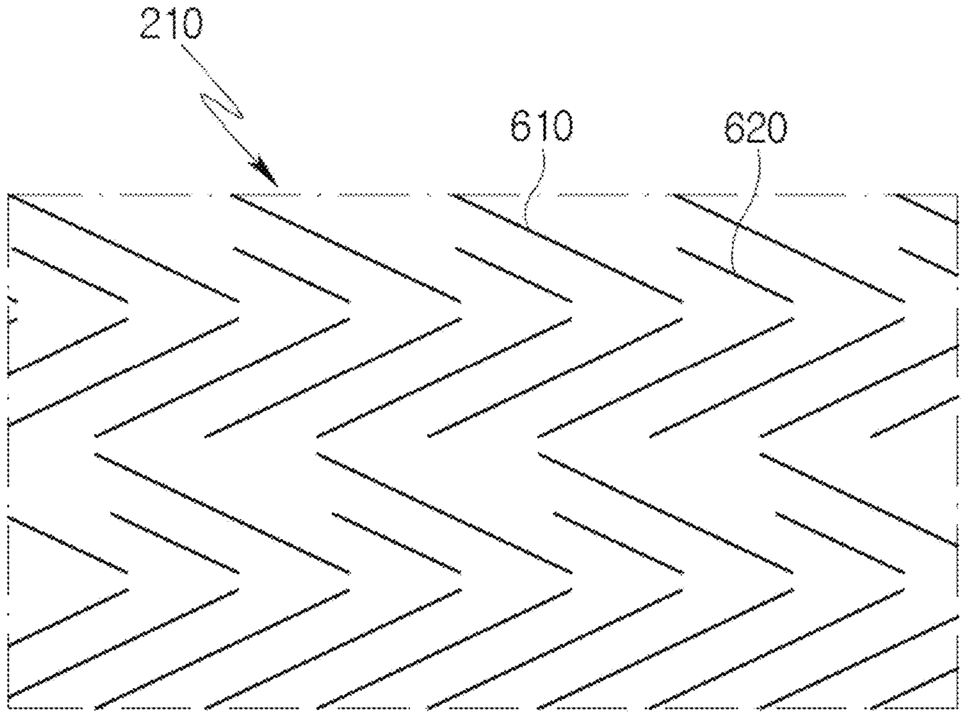
FIG. 10 and FIGS. 11(*a*) and 11(*b*) are plan views that show folding patterns according to various aspects of the present disclosure.

A reason behind occurrence of the moire effect will be explained in details. The folding pattern 220 refers to a concave form made after certain parts are removed in the cover window 200. FIG. 10 shows a folding pattern 810 that is formed after oval-shaped areas are removed. Since the cover window 200 is not fully vertically cut during an etching process, but cut crookedly, a taper 230 is formed. The taper 230 may be formed to be about 20 micro-meter wide. If the taper 230 exists in an up-lift side of a pixel 310, the light emitted by the pixel 310 may not be instantly delivered to a user, but refraction and scattering will take place. Among a plurality of pixels 310 disposed in the pixel substrate 300, the pixel interfering with the taper 230 existing in the cover window 200 in an upper layer and the pixel not interfering with the taper 230 will show difference in an image quality. If the interfering pixel forms a substantial area or pattern and such pattern becomes repeated and regular, a user recognizes the moire that shimmers. That is, the moire refers to a repeated pattern being recognized visibly.

Various aspects will be disclosed hereinafter, which aim to reduce repeated patterns being formed by the pixels 310 and the folding pattern 220.

Aspect Regarding an Angle of the Folding Pattern

Figure 7:
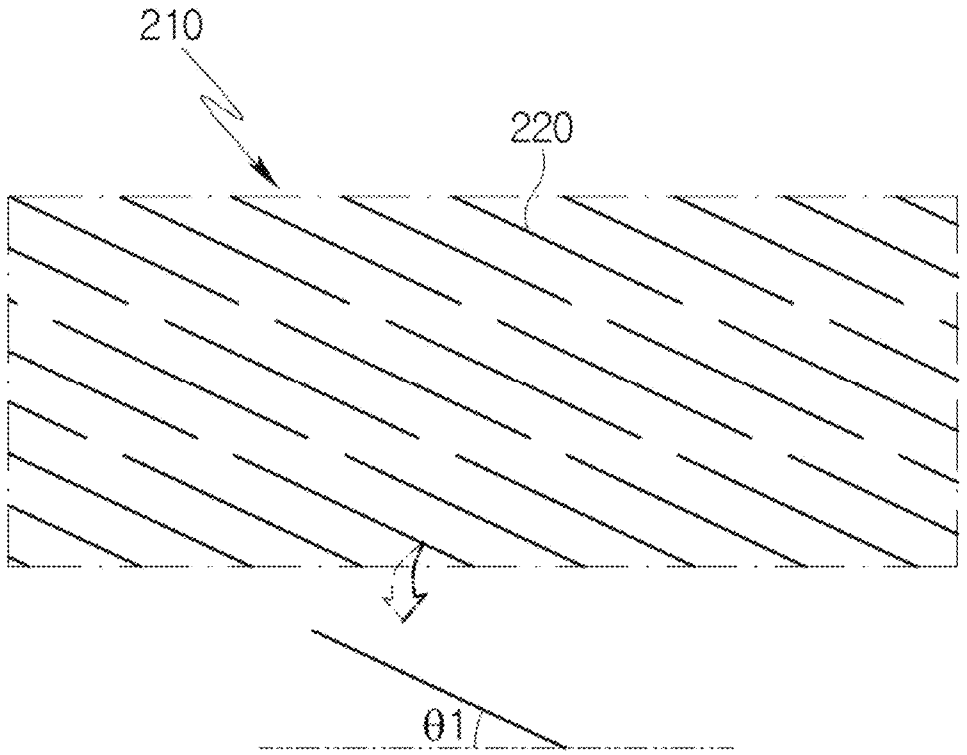
FIG. 7 is a plan view that shows a folding pattern according to an aspect of the present disclosure.

FIG. 7 is a plan view that shows a folding pattern according to the aspect of the present disclosure. Referring to FIG. 7, the folding pattern 220 according to the aspect may be equipped as a diagonal line. Being equipped as a diagonal line refers to making an acute angle at 0 degree or more based on the folding line 400. For example, the folding pattern 220 may make an angle between 5 degrees and 40 degrees with the folding line 400 of the display device. The angle here may refer to an angle measured in a clockwise direction or an anti-clockwise direction based on the folding line 400. The angle may refer to an acute angle. If the angle is made between 5 degrees and 40 degrees, the moire effect decreases and folding the display device has no trouble.

Table 1 shows a level of the moire effect observed depending on angles of the folding pattern of various aspects of the present disclosure. Figures in table 1 refer to visibility level of the moire effect, and exhibits relative values on condition that the highest visibility is scored 100.

TABLE 1

| Angle | Visibility | Angle | Visibility |
|---|---|---|---|
| 0° | 100 | 5° | 50 |
| 10° | 10 | 15° | 20 |
| 20° | 45 | 25° | 45 |
| 30° | 15 | 35° | 25 |
| 40° | 50 | 45° | 100 |

Table 1 shows that when the angle is set at 0 degree and 45 degrees, the moire occurs the most intensively. Visibility of the moire becomes clearer as a horizontal line at 0 degree and as a diagonal line at 45 degrees angle. When the angle is set at 5 degrees, 20 degrees, 25 degrees or 40 degrees, the moire decreased by a little bit. In such a case, visibility of the diagonal line pattern dramatically decreased compared to the case when the angle is set at 0 degree or 45 degrees. If the angle is set at 10 degrees, 15 degrees, 30 degrees or 35 degrees, the moire dramatically decreases, exhibiting very low visibility of the moire. In such a case, the repeated pattern cannot be recognized.

Table 1 shows that the result is observed to be symmetrical at large based on 22.5 degrees which is a mean value between 0 degree and 45 degrees. In addition, if the angle is set at 10 degrees to 15 degrees, the moire is dramatically reduced.

When the angle is set at 0 degree, 90 degrees, or 45 degrees, the folding pattern 220 or taper 230 is arranged side by side with the pixel. Apart from a case where the pixel pattern stands side by side with the folding line 400, when the pixel pattern makes an angle of 45 degrees with the folding line 400, the folding pattern 220 or the taper 230 stands side by side with the pixel.

When the angle is 0 degree, 90 degrees or 45 degrees, interference between the pixel and the taper 230 is intensified in a certain area. In an area where the taper 230 is positioned in a space between pixels, no pixel interferes, however in an area where the pixel and the taper 230 are on the same position, all pixels in the respective row will interfere with the taper. If so, all pixels in the row will show deteriorated image quality and the deterioration will be clearly recognized. And when the areas having interference is seen as repeated patterns, that is referred to as the moire effect.

Configuring to position the taper 230 to be disposed between pixels involves difficulty in the manufacturing process. As the display resolution improves and the number of pixels per inch (PPI) increases, pixel spacing is set to be very small to be around 20 μm, thus it is difficult to position the taper 230 to precisely position in such a small space in an actual panel design manufacturing process. Therefore, if the folding patterns 220 having an angle set at 0 degree or 45 degrees are disposed randomly and the tapers 230 are formed randomly, the moire will be formed per any row where the pixel 310 interferes with the taper 230.

If the angle is low at about 5 degrees, the pixel will or will not interfere with the taper 230 intensively as observed at 0 degree. However, a plurality of pixels interfere with the taper 230 in a part where the interference therebetween occurs. Several pixels sized to tens of micro-meter may be interfered in a series by the taper 230 sized to tens of micro-meter and inclined at a low angle. Therefore, pixels are interfered by the taper 230 in a considerably large area. Further, such pattern that is repeatedly seen and recognized visibly is referred to as the moire.

When the angle of the folding pattern 220 increases from 0 degree to 15 degrees, the moire tends to gradually decrease. In table 1, when the angle is set at 10 degrees or 15 degrees, moire visibility is very low, exhibiting few moire recognizable visibly. According to the same theory explained previously, since the areas of pixels existing in a series and interfering with the taper 230 are small, such areas cannot be recognized visibly as a regular pattern. At 10 to 15 degrees, the lengths of areas that the taper interferes with or not interferes with the pixel pattern each may increase more than the length measured at 5 degrees. When the angle is set between 10 and 15 degrees, the pattern will appear as an obscure rice shape rather than a regular pattern.

Table 1 shows a tendency where the moire effect becomes clearer as the angle increases in the aspect of having the angle set at 15 to 25 degrees. That is because the angle increases too high, and a length of an area exhibiting light clearly without interference becomes shorter, while a length of an area without interference with the taper 230 becomes shorter as well. In other words, the length of an area with interference and the length of an area without interference is similar, human eyes may see it as the moire as the repeatability gets intensified.

That is, at a small angle such as 5 degrees, the length of pixels existing in a series and interfered by the taper 230 is long, and the moire turns out, and at a big angle such as about 15 degrees to 25 degrees, ratio of pixels having interference with the taper 230 or pixels having no such interference is similar, resulting in increased visibility of the moire. When an angle of the folding pattern 220 is set at 10 degrees to 15 degrees, since the lengths of pixels existing in a series and interfering with the taper 230 are short and greatly differ from the lengths of pixels existing in a series and not interfering with the taper 230, advantage of reducing the moire is the highest.

Table 1 shows that an effect of reducing the moire is approximately symmetrical based on 22.5 degrees in an angle range set between 0 degree and 45 degrees. Experiment examples setting the angle at 30 degrees to 35 degrees show good result in reducing the moire. However, since meeting the purpose to easily fold the display device 100 is difficult if the pattern angle is too large, it is recommended that the folding pattern 220 to make an angle at 10 to 15 degrees with the folding line 400, rather than making an angle at 30 to 35 degrees.

Hereinafter, aspects with modified arranging elements of unit-patterns of the folding pattern 220 will be set forth, aiming to reduce repeatability of patterns formed by interference between the pixels 310 and the folding pattern 220.

Figure 8:
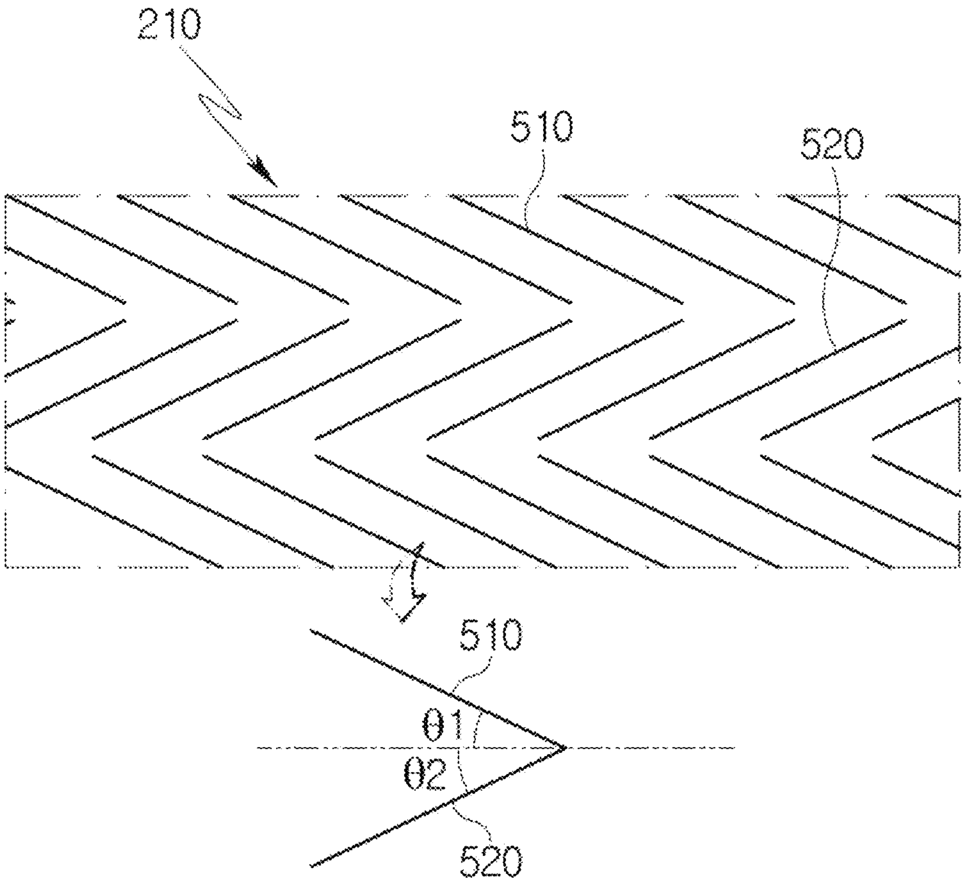
FIG. 8 is a plan view that shows a folding pattern according to another aspect of the present disclosure.

FIG. 8 is a plan view that shows a folding pattern according to another aspect of the present disclosure. The folding pattern according to the aspect may be configured symmetrically. Referring to FIG. 8, the folding pattern according to the aspect includes a first folding pattern 510 and a second folding pattern 520, and the first folding pattern 510 makes an angle at 5 to 40 degrees with the folding line in a clockwise direction, and the second folding pattern 520 makes an angle at 5 to 40 degrees with the folding line in an anti-clockwise direction. The angle here may be an acute angle. The angle of the first folding pattern 510 and that of the second folding pattern 520 may be the same or different. Symmetry in this context refers to a state that both the folding pattern having an angle in a clockwise direction with the folding line 400 and the folding pattern having an angle in an anti-clockwise direction exist, and the absolute values of the angles are not necessarily the same and is not limited to be the same.

In FIG. 8, the first folding pattern 510 may refer to a unit-pattern or unit-patterns having an angle in a clockwise direction at the uppermost part of the folding area 210. Also, the second folding pattern 520 may refer to a unit-pattern or unit-patterns having an angle in an anti-clockwise direction under the first folding pattern. The first folding pattern 510 and the second folding pattern are symmetrical.

If configuring a shape of a unit-pattern with a variety, the overall repeatability decreases compared with a case having the same shape of a unit-pattern only. More specifically, since a length or an extent of an area where the folding pattern is cyclically repeated in the overall folding area grows, number of the moire patterns being recognized visibly as repetition decreases or visible recognizability of the moire pattern decreases.

Figure 9:
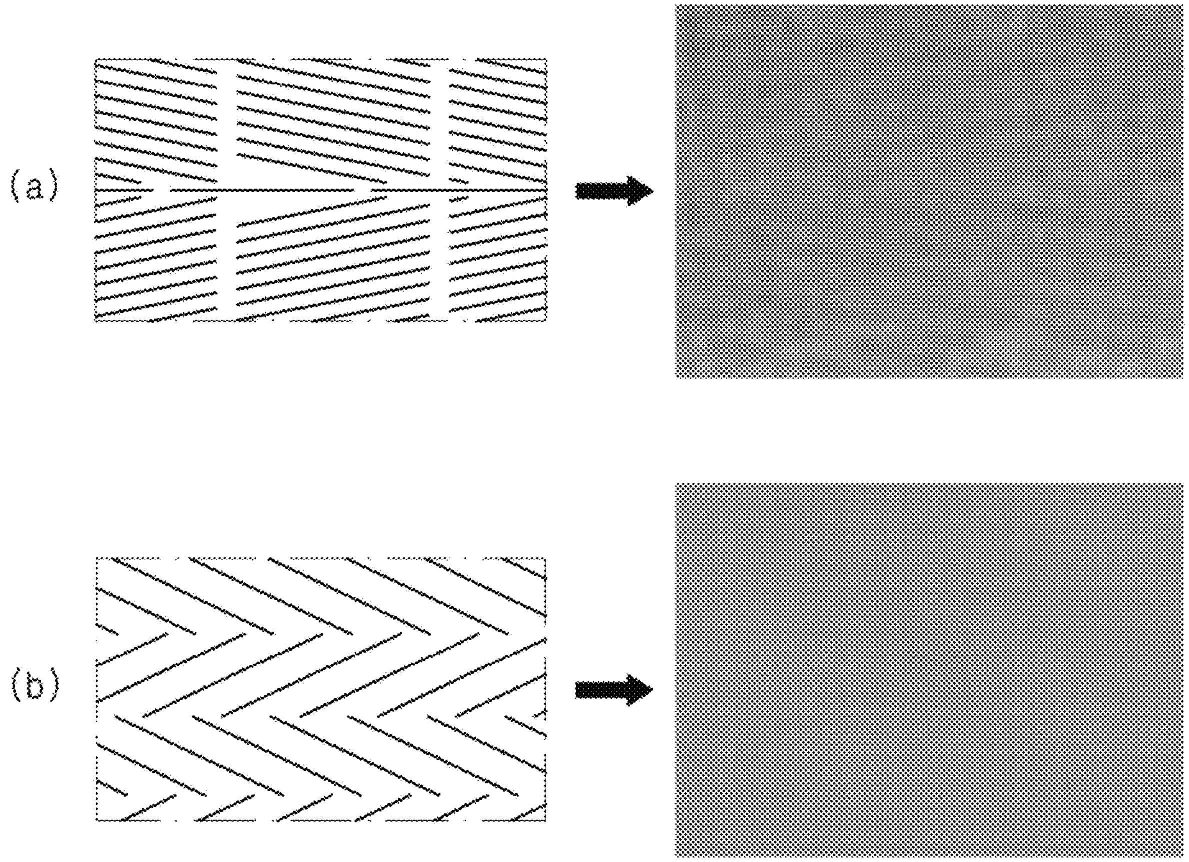
FIGS. 9(*a*) and 9(*b*) are drawings that show a moire effect observed depending on folding patterns of various aspects of the present disclosure.

FIGS. 9(*a*) and (*b*) are drawings that show a moire effect observed depending on folding patterns of various aspects of the present disclosure. The folding pattern in FIG. 9(*b*) is configured with the first folding pattern 510 and the second folding pattern 520 to show repeatedly, leading to an excellent advantage in the moire reduction. In FIG. 9(*a*), the same unit-patterns each disposed on the upside and the downside repeat and compared with a result in FIG. 9(*a*), the moire reduction of FIG. 9(*b*) is remarkable. Referring to FIGS. 9(*a*) and 9(*b*), if repetition cycle is small and the repeated pattern is densely shown, the moire appears clearly, and if repeating cycle is big and the repeated pattern is loosely shown, visibility of the moire drops.

Aspect Regarding a Length of a Unit-Pattern which Forms a Folding Pattern

Figure 11:
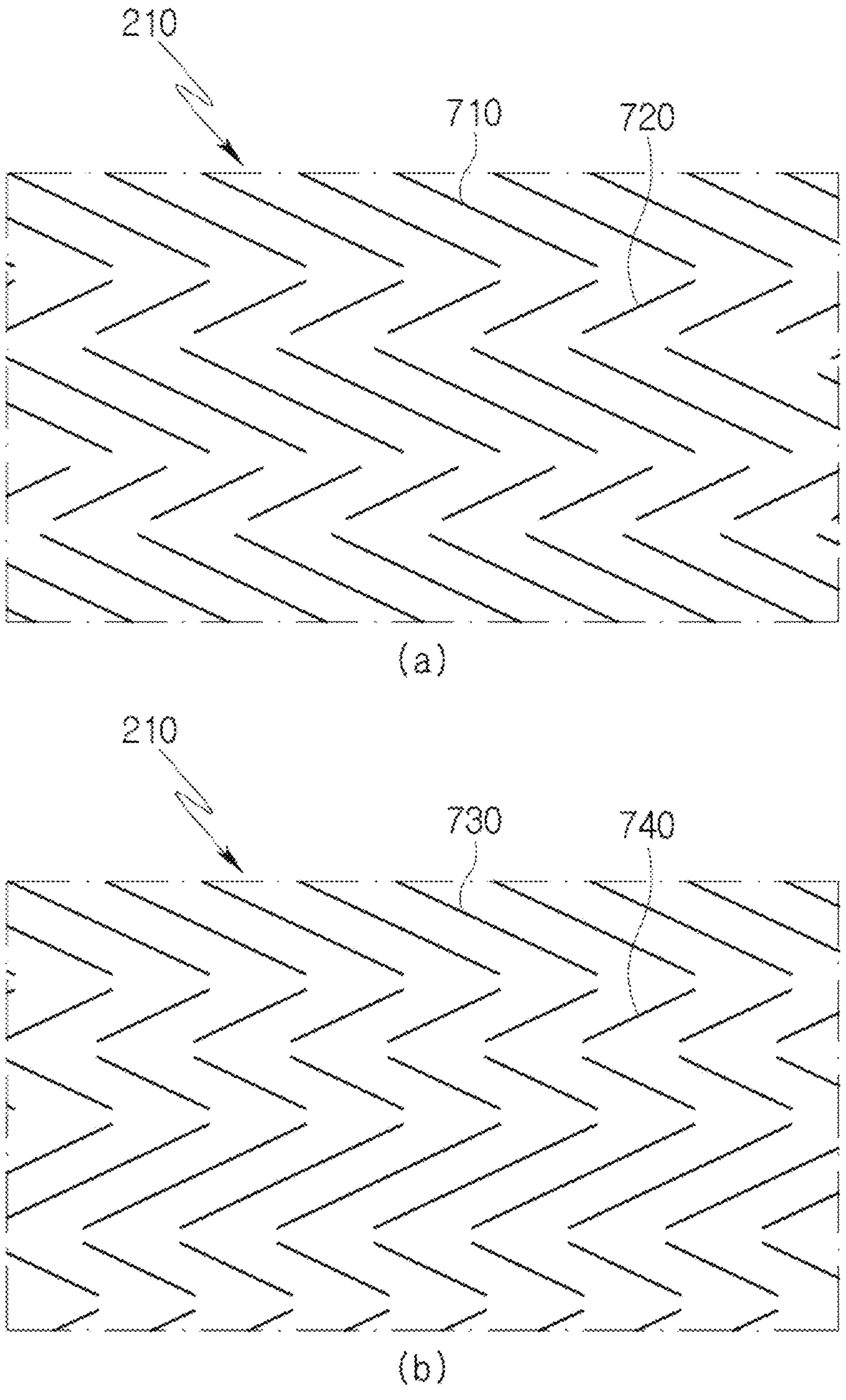

FIGS. 10, 11(*a*) and 11(*b*) show various aspects of folding patterns having two or more different lengths. According to the aspect, the folding pattern may have two or more unit-patterns that each of the unit-patterns has a different length. If configuring two or more lengths of the unit pattern, repeatability of the pattern decreases, and the moire effect decreases.

First, FIG. 10 will be referred in explanation. FIG. 10 shows a folding pattern in which unit-patterns having two different lengths are configured to repeat in a width-wise direction. According to the aspect, the folding pattern may be configured to repeat the unit-patterns having two different lengths. For example, a long unit-pattern 610 and a short unit-pattern 620 may be repeatedly arranged. At this time, a cycle of the repeated area becomes larger in a widthwise direction. As the length of the unit-pattern is varied, a cycle of the repeated area increases and repeatability decreases.

Another aspect as shown in FIGS. 11(*a*) and 11(*b*) will be explained hereinafter. FIGS. 11(*a*) and 11(*b*) shows a folding pattern of which unit patterns having two different lengths are configured to repeat in a height-wise direction. A first folding pattern 710 having an angle in a clockwise direction with the folding line 400 may be configured to have a length that differs from a length of a second folding pattern 720 having an angle in an anti-clockwise direction. FIG. 11(*a*) refers to a folding pattern having long, short and long unit-patterns in a widthwise direction and FIG. 11(*b*) refers to a folding pattern having long, short, short and long unit patterns in a height-wise direction. Further, the folding patterns of FIGS. 11(*a*) and 11(*b*) may be modified that each unit-pattern in each layer to have varied length. As such, angles and lengths of the unit-pattern of the folding pattern may be configured to vary. As the variety is widened, repeatability and the moire effect decrease.

A method to configure lengths of the unit-patterns to vary is not limited by as to whether the lengths are in a width-wise direction or a height-wise direction. For example, lengths of the folding pattern may be randomized in a width-wise direction or a height-wise direction. Or, the folding pattern may be disposed with inclination, rather than being disposed in a width-wise direction.

Aspect Regarding Pixel Arrangement in the Pixel Substrate

Figure 12:
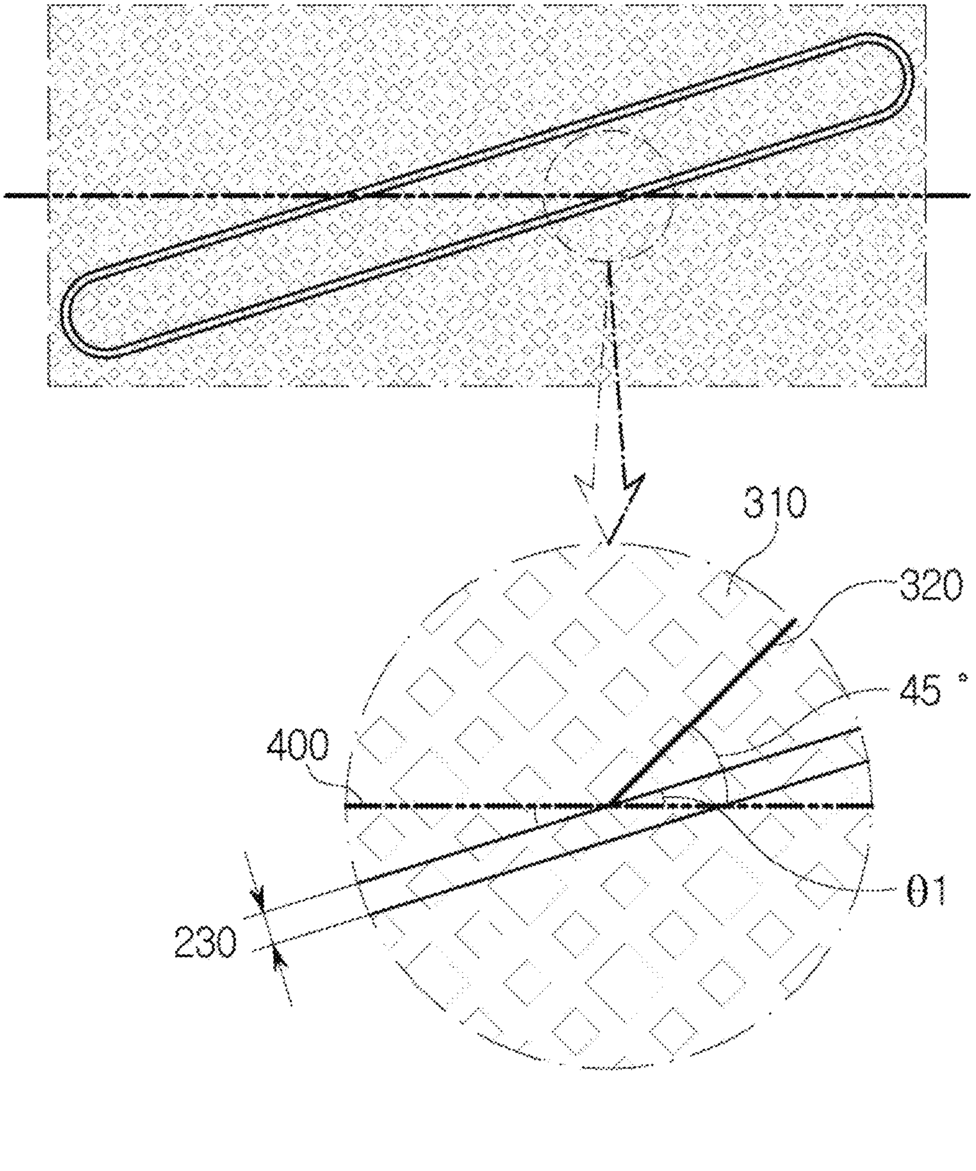
FIG. 12 is a plan view that shows a position relation of pixel patterns and folding patterns according to the aspect of the present disclosure.

FIG. 12 is a plan view that shows a position relation of pixel patterns and folding patterns according to the aspect of the present disclosure. According to the aspect, the pixel pattern 320 of the pixel 310 may make an angle of 45 degrees with the folding line 400. Further, the folding pattern 810 may make an angle of 10 degrees to 15 degrees with the folding line 400. In FIG. 12, a shape of the folding pattern 810 is shown in detail. FIG. 12 shows that the taper 230 makes an angle with the folding line 400, and it may be understood that the folding pattern 810 makes an angle with the folding line 400.

Referring to Table 1, Table 1 shows an example of an experiment that uses the display device 100 of which a pixel pattern 320 of a certain color makes an angle of 45 degrees with the folding line 400. The result of Table 1 appears to be approximately symmetrical based on 22.5 degrees within the range of 0 degree to 45 degrees and a case having an angle of 10 degrees to 15 degrees has more excellent result in decreasing the moire effect than a case having an angle of 35 degrees. The pixel pattern 320 refers to a virtual line connecting the nearest pixels of the same color. If the pixel pattern 320 makes an angle of 45 degrees with the folding line 400, a distance between pixels measured in the same direction as the folding line 400 is 1.414 times a distance between pixels measured in the direction of the pixel pattern 320. That is, a distance between pixels adjacent to the left and the right sides is 1.414 times a distance of pixels adjacent diagonally. Therefore, an example of having an angle of 10 degrees to 15 degrees which is closer to wider pixel distance has excellent effect of reducing the moire compared with an example of having an angle of 30 degrees. That is because the overall repeatability decreases to 0.7 times as the pixel distance gets 1.4 times farther.

To the contrary, when it comes to a display device having the pixel pattern of the pixel substrate standing side by side with the folding line, a case having an angle of 30 degrees to 35 degrees has more excellent result than a case having an angle of 10 degrees to 15 degrees. However, as explained previously, an angle of the folding pattern may need to be maintained in the lower range to meet the purpose of easily folding the display device. Therefore, it is more advantageous to dispose the pixel pattern to make an angle of 45 degrees with the folding line and to dispose the folding pattern to make an angle of 10 degrees to 15 degrees with the folding line than to dispose the pixel pattern to stand side by side with the folding line and dispose the folding pattern to make an angle of 30 degrees to 35 degrees with the folding line.

Aspect Regarding an Angle of Unit-Patterns

Referring to FIGS. 13 to 16, a display device having two or more different angles of the folding pattern will be explained hereinafter according to various aspects of the present disclosure.

Figure 13:
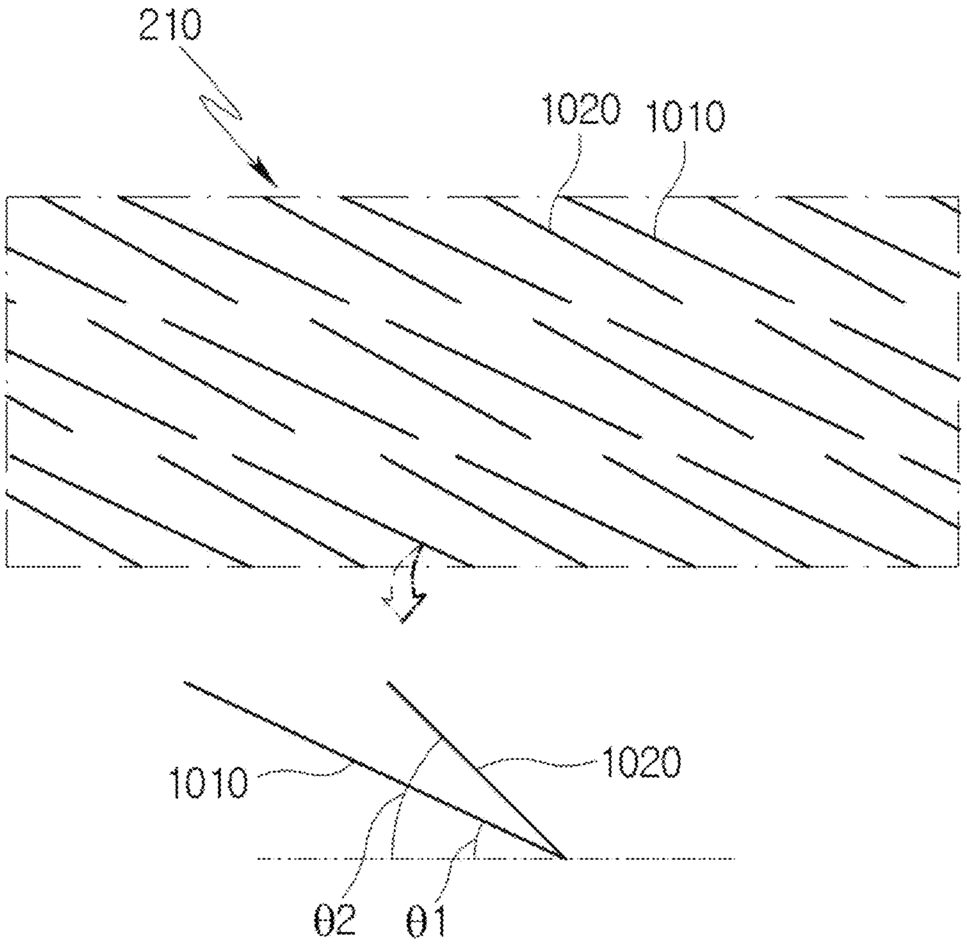
FIGS. 13 to 16 are plan views that show randomized angles of folding patterns according to various aspects of the present disclosure.

FIG. 13 will be explained first. The display device according to the aspect includes a pixel substrate equipped with pixels; and a cover window disposed on an upper surface of the pixel substrate and includes a folding pattern, and the folding pattern includes a first folding pattern and a second folding pattern and the first folding pattern and the second folding pattern each may make different acute angles in the same direction with a folding line of the display device. Making an angle in the same direction refers to a case where a first folding pattern 1010 and a second folding pattern 1020 both make angles with the folding line in a clockwise direction, or both make angles with the folding line in an anti-clockwise direction. In addition, an angle of the first folding pattern and an angle of the second folding pattern may differ from each other. FIG. 13 shows an angle of the second folding pattern 1020 is bigger than an angle of the first folding pattern 1010.

In the present disclosure, randomization of an angle refers to configuring at least two of the unit-patterns forming the folding pattern to have different angles. Making angles of the folding pattern vary may be fulfilled by changing angles of the unit-patterns forming the folding pattern all at once, or by changing each unit-pattern to have a different angle.

Randomization of angles provides an excellent result in reducing the moire effect compared with randomization of lengths of unit-patterns. If an angle is fixed, an area where the taper interferes with the pixels and an area where the taper does not interfere with the pixels appear regularly in the display device. If the angle is changing, a cycle of an area where the taper interferes with the pixel appears totally differs from a cycle of an area where the taper does not interfere with the pixel appears in the display device. In Table 1, shapes of the moire effect are totally different depending on angles. If the unit-patterns each having a different angle are formed to stand side by side, the areas where each unit-pattern interfere with the pixels appear to be totally different from each other, therefore, the areas do not form a repeated pattern. Compared with merely configuring the folding patterns each having a certain angle to be disposed symmetrically, the previous method of disposing the unit-patterns each having a different angle to stand side by side provides dramatically excellent result in reducing the moire effect.

Figure 14:
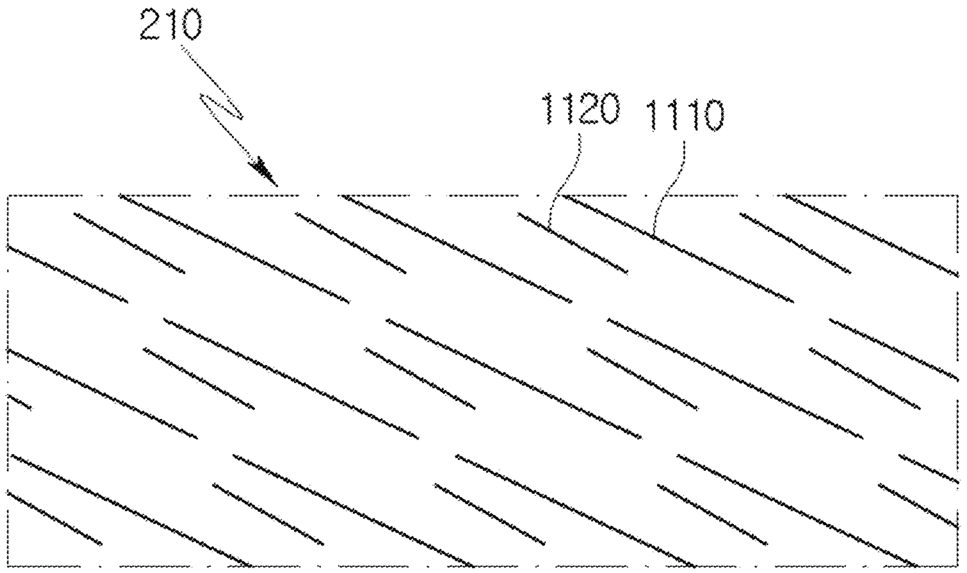

Hereinafter, a display device that disposes the folding pattern having two or more different angles and two or more different lengths will be explained by referring to FIG. 14. According to the aspect, a unit-pattern of a first folding pattern 1110 and a unit-pattern of a second folding pattern 1120 may be further configured to have different lengths. This method may provide an effect of a length randomization as previously described as well as an effect of an angle randomization. Therefore, the display device may have further excellent reduction of the moire effect.

Figure 15:
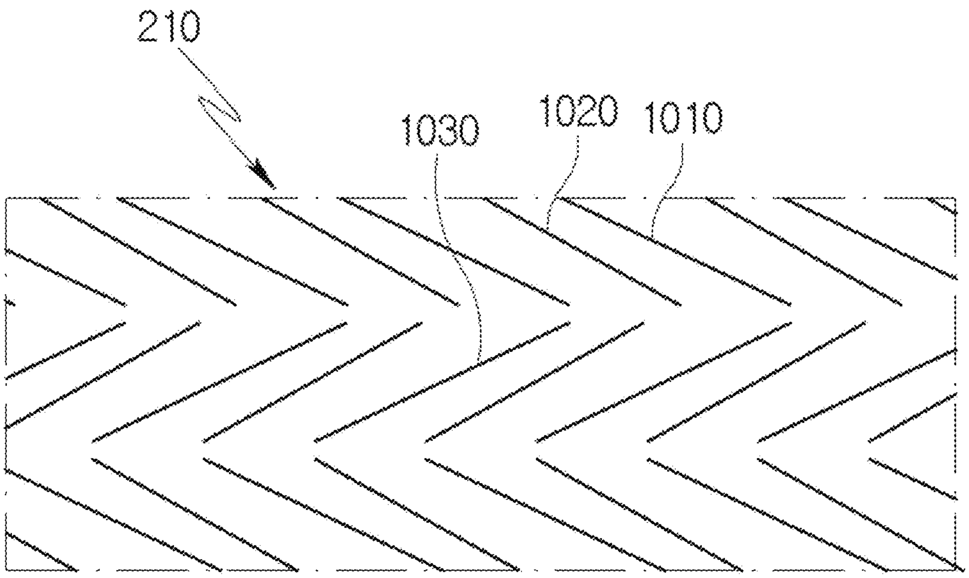

Hereinafter, a display device that disposes the folding pattern having two or more different angles and each of the folding patterns configured to be symmetrical on the upside and the downside will be explained by referring to FIG. 15. According to the aspect, the folding pattern further includes a third folding pattern and the third folding pattern 1030 may make an acute angle with the folding line 400 in a direction opposite to a direction where an angle of a first folding pattern 1010 and a second folding pattern 1020 is formed.

That is, for example, the first folding pattern 1010 and the second folding pattern 1020 may have an angle in a clockwise direction with the folding line, and the third folding pattern 1030 may have an angle in an anti-clockwise direction with the folding line. In such an instance, at least two among the first folding pattern 1010, the second folding pattern 1020 and the third folding pattern 1030 may have different angles. Inserting the folding pattern configured in symmetrical directions provides an effect of expanding repetition cycle and reducing the moire. Configuration in symmetrical directions means that the folding pattern having an angle in a clockwise direction with the folding line and the folding pattern having an angle in an anti-clockwise direction both exist as explained, and there is no limitation that the absolute values of the angles are the same.

Figure 16:
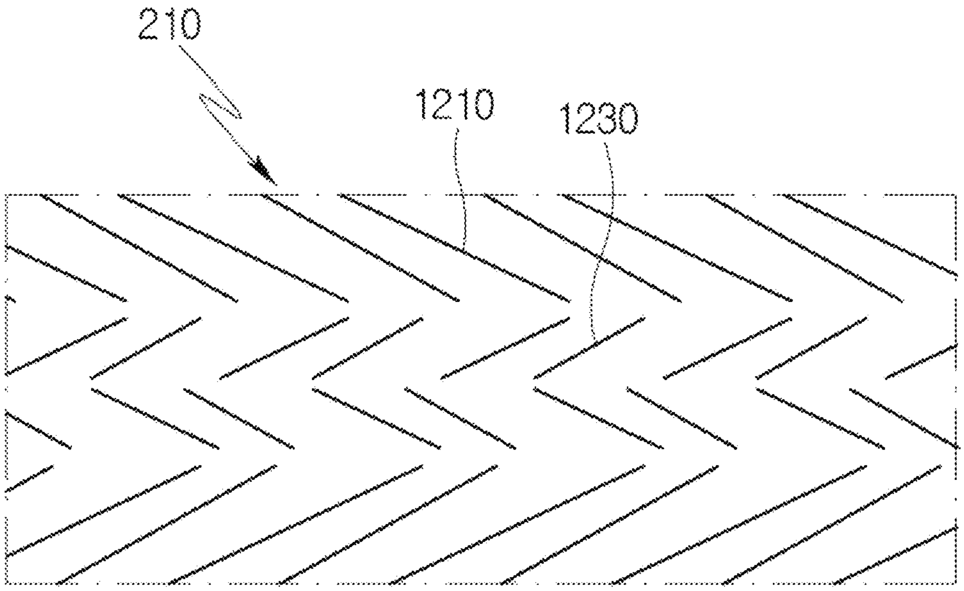

Hereinafter, a display device disposing the folding pattern having two or more different angles and two or more different lengths, with the folding pattern configured in symmetry on the upside and the downside will be explained by referring to FIG. 16. The display device in the FIG. 16 differs from the display device of FIG. 15 in that the lengths of the folding patterns arranged in different layers in which the angles of the folding patterns are symmetric are different. A third folding pattern 1230 may make an acute angle with the folding line 400 in a direction opposite to a direction where an angle of a first folding pattern 1210 is formed. Here, angles of the first folding pattern 1210 and the third folding pattern 1230 may be different from each other. Further, lengths of a unit-pattern of the first folding pattern 1210 and a unit-pattern of the third folding pattern 1230 may be different from each other. The display device may randomize pattern lengths while disposing the folding pattern in symmetric directions.

Figure 17:
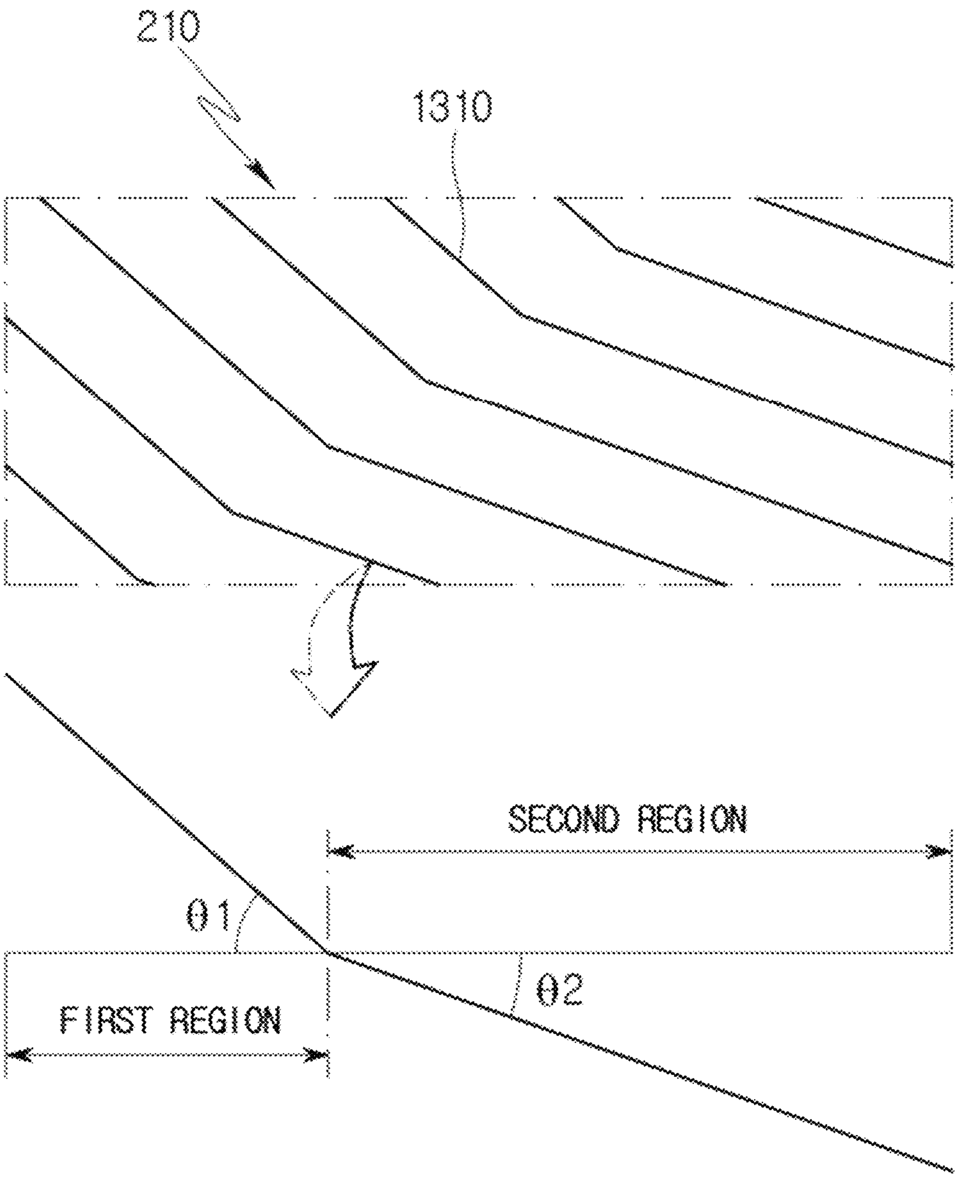
FIG. 17 is a plan view that shows a single pattern of folding patterns having two or more angles according to the aspect of the present disclosure.

Aspect Regarding Having Different Angles in a Plurality of Areas of a Unit-Pattern Referring to FIG. 17, a display device where a single pattern of the folding pattern 1310 has two or more different angles will be explained hereinafter according to the aspect of the present disclosure. FIG. 17 is a plan view that shows a single pattern of the folding pattern 1310 having two or more angles according to the aspect of the present disclosure.

In the display device according to the aspect, a single pattern of the folding pattern 1310 includes a first area and a second area, and the first area and the second area may make each different acute angle with the folding line of the display device in the same direction. As the aspect of configuring various angles of the folding pattern, it is possible to configure a single pattern, that is one pattern, to have two or more angles. As in the enlarged view below the first drawing in FIG. 17, a single pattern of the folding pattern 1310 may include a first area having a first angle and a second area having a second angle.

The first angle of the first area and the second angle of the second area each may be between 10 degrees and 15 degrees in the aspect. In other words, a single pattern of the folding pattern may form two or more different angles between 10 degrees and 15 degrees with the folding line. As shown in the previous Table 1 and the like, making an angle between 10 degrees and 15 degrees with the folding line provides the most excellent reduction of the moire effect, therefore when configuring angles of a single pattern variously, the most excellent moire reduction may be expected if configuring angles of a single pattern to be set between 10 degrees and 15 degrees.

If dividing a unit-pattern of the folding pattern 1310 into multiple areas and configuring the unit-pattern to have multiple angles, result of the moire reduction is excellent compared with a case where a unit-pattern has a single angle. Similar to the aspect that configures to make various angles of unit-patterns, a case where a single unit-pattern has multiple angles does not form repeated patterns since an area where a unit-pattern interferes with a pixel appears differently depending on an angle. In other words, a cycle that an area where the taper interferes with the pixel appears and a cycle that an area where the taper does not interfere with the pixel appears become totally different. Since a unit-pattern having multiple angles becomes a single repetition cycle and the repetition cycle becomes larger, a unit-pattern having multiple angles may provide a remarkably excellent result in reducing the moire effect.

Aspect Regarding Curved Unit-Patterns

Figure 18:
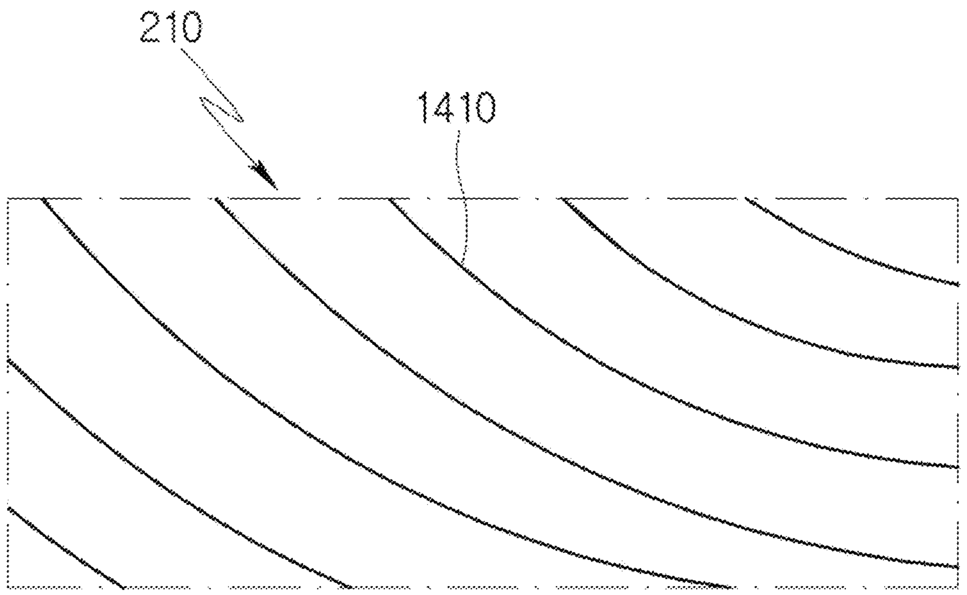
FIG. 18 is a plan view that shows folding patterns having curved patterns according to the aspect of the present disclosure.

Referring to FIG. 18, a display device having curved unit-patterns of the folding pattern 1410 will be explained hereinafter according to the aspect of the present disclosure. FIG. 18 is a plan view that shows folding patterns having curved patterns according to the aspect of the present disclosure. The display device according to the aspect may include the folding pattern 1410 having curved unit-patterns. It is possible to configure the entire unit-patterns to be curves, or configure some of the unit-patterns to be curves, and some of them to be straight lines. Also, curves of a single pattern may have various curvatures.

Further, a curve of the folding pattern 1410 may make an angle between 10 degrees and 15 degrees with the folding line of the display device. In the aspect, a curve having an angle between 10 degrees and 15 degrees with the folding line of the display device may mean that a tangent line of a curve has an angle between 10 degrees and 15 degrees with the folding line. In other words, at least some of the single pattern may be configured as curves, as the angle with the folding line consecutively changes within an angle range between 10 degrees and 15 degrees.

Configuring a unit-pattern of the folding pattern 1410 as a curve provides more excellent result in the moire reduction, compared with an example where a unit-pattern is configured with a single angle that is a straight line. Geometrically, it may be understood that the angle is consecutively changed in a curve. Therefore, like the aspect of a unit-pattern having varied angles, a cycle of an area where the taper interferes with the pixel appears and a cycle of an area where the taper does not interfere with the pixel appears become to vary. By configuring curved unit-patterns of the folding pattern, the repetition cycle becomes larger, therefore the display device achieves an excellent reduction in the moire effect.

The display device according to aspects of the present disclosure may be explained as below.

The display device according to the aspect of the present disclosure includes a pixel substrate equipped with pixels; and a cover window disposed on an upper surface of the pixel substrate and including a folding pattern, and the folding pattern may make an angle between 5 degrees and 40 degrees with a folding line of the display device.

The display device according to the aspect of the present disclosure includes the folding pattern including a first folding pattern and a second folding pattern, and the first folding pattern may make an angle between 5 degrees and 40 degrees with the folding line in a clockwise direction; and the second folding pattern may make an angle between 5 degrees to 40 degrees with the folding line in an anti-clockwise direction.

In the display device according to the aspect of the present disclosure, at least one among the first folding pattern and the second folding pattern has two or more unit-patterns each having a different length.

In the display device according to the aspect of the present disclosure, a unit-pattern of the first folding pattern and a unit-pattern of the second folding pattern have different lengths.

In the display device according to the aspect of the present disclosure, the folding pattern may make an angle between 10 degrees and 15 degrees or between 30 degrees and 35 degrees with the folding line.

In the display device according to the aspect of the present disclosure, a pixel pattern of the pixel may make at least one angle among 0 degree, 45 degrees and 90 degrees with the folding line.

In the display device according to the aspect of the present disclosure, a single pattern of the folding pattern includes a first area and a second area and the first area and the second area each make a different acute angle in the same direction with the folding line of the display device.

In the display device according to the aspect of the present disclosure, the acute angle may be between 10 degrees and 15 degrees.

In the display device according to the aspect of the present disclosure, the folding pattern includes a curve and the curve may make an angle between 10 degrees and 15 degrees with the folding line of the display device.

The display device according to the aspect of the present disclosure includes a pixel substrate equipped with pixels; and a cover window disposed on an upper surface of the pixel substrate and includes a folding pattern, and the folding pattern includes a first folding pattern and a second folding pattern and the first folding pattern and the second folding pattern each make a different acute angle in the same first direction with a folding line of the display device.

In the display device according to the aspect of the present disclosure, a unit-pattern of the first folding pattern and a unit-pattern of the second folding pattern have different lengths.

In the display device according to the aspect of the present disclosure, the folding pattern further comprises a third folding pattern and the third folding pattern may make an acute angle with the folding line in an opposite direction to the first direction.

In the display device according to the aspect of the present disclosure, a unit-pattern of the first folding pattern and a unit-pattern of the third folding pattern have different lengths.

In the display device according to the aspect of the present disclosure, the first folding pattern and the second folding pattern each make an angle between 10 degrees and 15 degrees or between 30 degrees and 35 degrees with the folding line.

In the display device according to the aspect of the present disclosure, a pixel pattern of the pixel may make at least one angle among 0 degree, 45 degrees and 90 degrees with the folding line.

Explained above are various aspects of the present disclosure with accompanying drawings. However, the present disclosure is not limited by the aspects explained above, and the aspects explained may be implemented in many different forms by those skilled in the art without departing from the spirit of the present disclosure as defined by the appended claims. Further, it should not be understood that such modified aspects are separate from the technical idea or the scope of the present disclosure. Therefore, the technical scope of the present disclosure should be determined only by the appended claims.

REFERENCE NUMERALS

100: DISPLAY DEVICE
200: COVER WINDOW
210: FOLDING PATTERN AREA
220, 810, 1310, 1410: FOLDING PATTERN
230: TAPER
300: PIXEL SUBSTRATE
310: PIXEL
311_1, 311_2, 311_3: RED PIXEL
312_1, 312_2, 312_3: GREEN PIXEL
313_1, 313_2, 313_3: BLUE PIXEL
320: PIXEL PATTERN
400: FOLDING LINE
510, 710, 730, 1010, 1110, 1210: FIRST FOLDING PATTERN
520, 720, 740, 1020, 1120: SECOND FOLDING PATTERN
610: LONG UNIT-PATTERN
620: SHORT UNIT-PATTERN
1030, 1230: THIRD FOLDING PATTERN

What is claimed is:

1. A display device comprising:
a pixel substrate including pixels; and
a cover window disposed on an upper surface of the pixel substrate and including a folding pattern,
wherein the folding pattern includes a plurality of linear recesses formed in the cover window,
wherein each of the plurality of linear recesses is configured as an isolated linear segment that is spaced apart from other linear recesses, and
wherein each of the plurality of linear recesses is diagonally arranged to be angled between 5 degrees and 40 degrees with respect to a folding line of the display device.

2. The display device of claim 1, wherein a cross section of each of the plurality of linear recesses in the folding pattern has a concave shape made after predetermined parts are removed in the cover window.

3. The display device of claim 1, wherein the folding pattern includes a first folding pattern and a second folding pattern,
wherein the first folding pattern includes a plurality of first linear recesses, each of which is diagonally arranged to be angled between 5 degrees and 40 degrees with respect to the folding line in a clockwise direction, and
wherein the second folding pattern includes a plurality of second linear recesses, each of which is diagonally arranged to be angled between 5 degrees and 40 degrees with respect to the folding line in an anti-clockwise direction.

4. The display device of claim 3, wherein at least one of the first folding pattern or the second folding pattern has two or more linear recesses each having a different length.

5. The display device of claim 3, wherein a first linear recess of the first folding pattern and a second linear recess of the second folding pattern have different lengths.

6. The display device of claim 1, wherein each of the plurality of linear recesses in the folding pattern is diagonally arranged to be angled between 10 degrees and 15 degrees or between 30 degrees and 35 degrees with respect to the folding line.

7. The display device of claim 6, wherein a pixel pattern of the pixels makes at least one angle among 0 degree, 45 degree and 90 degree with respect to the folding line.

8. The display device of claim 1, wherein a single pattern of the folding pattern includes a first area and a second area, and wherein linear recesses in the first area and in the second area each make a different acute angle in a same direction with respect to the folding line of the display device.

9. The display device of claim 8, wherein each acute angle is between 10 degrees and 15 degrees.

10. The display device of claim 1, wherein the folding pattern includes a curved recess, and wherein the curved recess makes an angle between 10 degrees and 15 degrees with respect to the folding line of the display device.

11. A display device comprising:

a pixel substrate including pixels; and a cover window disposed on an upper surface of the pixel substrate and including a folding pattern, wherein the folding pattern comprises a first folding pattern and a second folding pattern, wherein the first folding pattern includes a plurality of first linear recesses formed in the cover window and extending along a first direction, wherein the second folding pattern includes a plurality of second linear recesses formed in the cover window and extending along a second direction, wherein each of the plurality of first linear recesses and each of the plurality of second linear recesses is configured as an isolated linear segment that is spaced apart from other first linear recesses and other second linear recesses, and wherein the first direction and the second direction each make a different acute angle in a same first direction with respect to a folding line of the display device.

12. The display device of claim 11, wherein a cross section of each of the plurality of first linear recesses and each of the plurality of second linear recesses in the folding pattern is a concave form made after certain parts are removed in the cover window.

13. The display device of claim 11, wherein a first linear recess of the first folding pattern and a second linear recess of the second folding pattern have different lengths.

14. The display device of claim 11, wherein the folding pattern further comprises a third folding pattern, wherein the third folding pattern includes a plurality of third linear recesses formed in the cover window, wherein each of the plurality of third linear recesses is configured as an isolated linear segment that is spaced apart from the plurality of first linear recesses, the plurality of second linear recesses, and other third linear recesses, and wherein each of the plurality of third linear recesses in the third folding pattern is diagonally arranged to be angled in an opposite direction to the first direction.

15. The display device of claim 14, wherein a first linear recess of the first folding pattern and a third linear recess of the third folding pattern have different lengths.

16. The display device of claim 11, wherein each of the plurality of first linear recesses in the first folding pattern and each of the plurality of second linear recesses in the second folding pattern is diagonally arranged to be angled between 10 degrees and 15 degrees or between 30 degrees and 35 degrees with respect to the folding line.

17. The display device of claim 11, wherein a pixel pattern of the pixels makes at least one angle among 0 degree, 45 degrees and 90 degrees with respect to the folding line.

* * * * *